US006759769B2

(12) United States Patent
Kirjavainen

(10) Patent No.: US 6,759,769 B2
(45) Date of Patent: Jul. 6, 2004

(54) ELECTROMECHANIC FILM AND ACOUSTIC ELEMENT

(76) Inventor: Kari Kirjavainen, Palomäentie 14 B 13, Tampere (FI), 33230

( * ) Notice: Subject to any disclaimer, the term of this patent is extended or adjusted under 35 U.S.C. 154(b) by 5 days.

(21) Appl. No.: 10/153,817

(22) Filed: May 24, 2002

(65) Prior Publication Data

US 2003/0052570 A1 Mar. 20, 2003

Related U.S. Application Data

(63) Continuation of application No. PCT/FI00/01027, filed on Nov. 24, 2000.

(30) Foreign Application Priority Data

Nov. 25, 1999 (FI) ............................................... 992514

(51) Int. Cl.[7] ............................................... G11C 13/02

(52) U.S. Cl. ....................... 307/400; 310/800; 310/365; 381/191; 367/180; 252/62.9

(58) Field of Search .......................... 307/400; 381/163, 381/190, 191; 252/62.9, 570, 571; 367/180; 73/1.15, 1.48, 35.11, 35.13, 514.34; 310/800, 365, 367

(56) References Cited

U.S. PATENT DOCUMENTS

| | | | | |
|---|---|---|---|---|
| 2,975,307 A | * | 3/1961 | Schroeder et al. | 310/309 |
| 3,632,443 A | * | 1/1972 | Kodera et al. | 307/400 |
| 3,788,133 A | * | 1/1974 | Paelian et al. | 73/862.55 |
| 3,947,644 A | | 3/1976 | Uchikawa | |
| 4,056,742 A | * | 11/1977 | Tibbetts | 310/357 |
| 4,186,323 A | * | 1/1980 | Cragg et al. | 310/324 |
| 4,250,415 A | * | 2/1981 | Lewiner et al. | 307/400 |
| 4,315,557 A | * | 2/1982 | Nakaya et al. | 181/168 |
| 4,359,726 A | * | 11/1982 | Lewiner et al. | 340/666 |
| 4,390,800 A | * | 6/1983 | Tanaka et al. | 307/400 |
| 4,400,634 A | * | 8/1983 | Micheron | 307/400 |
| 4,419,545 A | * | 12/1983 | Kuindersma | 381/165 |
| 4,429,193 A | * | 1/1984 | Busch-Vishniac et al. | 381/113 |
| 4,434,327 A | * | 2/1984 | Busch-Vishniac et al. | 381/113 |
| 4,442,324 A | * | 4/1984 | Blanchard et al. | 381/173 |
| 4,443,711 A | * | 4/1984 | Tanaka et al. | 307/400 |
| 4,455,494 A | * | 6/1984 | Tanaka et al. | 307/400 |
| 4,458,161 A | * | 7/1984 | Wada et al. | 307/400 |

(List continued on next page.)

FOREIGN PATENT DOCUMENTS

| | | | | |
|---|---|---|---|---|
| FI | 913741 | | 2/1993 | |
| JP | 56-047199 | | 4/1981 | |
| JP | 59-228919 | * | 12/1984 | B01D/39/16 |
| JP | 2000-218112 | * | 8/2000 | B01D/39/14 |

OTHER PUBLICATIONS

Dupont, "High Performance Films DuPont FEP fluorocarbon film Properties Bulleting"; Dec. 1996.*

*Primary Examiner*—Brian Sircus
*Assistant Examiner*—Roberto J Rios
(74) *Attorney, Agent, or Firm*—Young & Thompson

(57) ABSTRACT

An electromechanic film intended for transforming electric energy into mechanical energy and transforming mechanical energy into electric energy. The film (1) is dielectric and formed of cells (3), the ratio of the height and width of which cells is between 3:1 and 1:3. By joining two such films together and controlling them in such a way that in the first film (1) the electric field strength decreases and in the second film (1) the electric field strength increases, a bending acoustic element is provided.

10 Claims, 3 Drawing Sheets

U.S. PATENT DOCUMENTS

| | | | | | |
|---|---|---|---|---|---|
| 4,472,604 | A | * | 9/1984 | Nakamura et al. | 381/425 |
| 4,513,049 | A | * | 4/1985 | Yamasaki et al. | 428/194 |
| 4,518,555 | A | * | 5/1985 | Ravinet et al. | 264/292 |
| 4,654,546 | A | | 3/1987 | Kirjavainen | |
| 4,810,913 | A | * | 3/1989 | Beauducel et al. | 310/337 |
| 4,891,843 | A | * | 1/1990 | Paulus et al. | 381/191 |
| 5,115,810 | A | * | 5/1992 | Watanabe et al. | 600/459 |
| 5,164,920 | A | * | 11/1992 | Bast et al. | 367/140 |
| 5,334,413 | A | * | 8/1994 | Ishida et al. | 427/130 |
| 5,395,592 | A | * | 3/1995 | Bolleman et al. | 422/128 |
| 5,422,532 | A | * | 6/1995 | Inoue et al. | 310/326 |
| 5,436,054 | A | * | 7/1995 | Tani et al. | 428/131 |
| 5,530,678 | A | * | 6/1996 | Kosalos | 367/13 |
| 5,559,387 | A | * | 9/1996 | Beurrier | 310/328 |
| 5,682,075 | A | * | 10/1997 | Bolleman et al. | 310/309 |
| 5,757,090 | A | * | 5/1998 | Kirjavainen | 307/400 |
| 5,869,767 | A | * | 2/1999 | Hayward et al. | 73/774 |
| 5,889,354 | A | * | 3/1999 | Sager | 310/331 |
| 5,901,928 | A | * | 5/1999 | Raskob, Jr. | 244/204 |
| 5,917,437 | A | * | 6/1999 | Ojala et al. | 310/366 |
| 6,104,126 | A | * | 8/2000 | Gilmore | 310/334 |
| 6,184,608 | B1 | * | 2/2001 | Cabuz et al. | 310/309 |
| 6,184,609 | B1 | * | 2/2001 | Johansson et al. | 310/328 |
| 6,255,758 | B1 | * | 7/2001 | Cabuz et al. | 310/309 |
| 6,304,662 | B1 | * | 10/2001 | Norris et al. | 381/191 |
| 6,346,761 | B1 | * | 2/2002 | Isobe et al. | 310/313 B |
| 6,438,242 | B1 | * | 8/2002 | Howarth | 381/190 |
| 6,545,395 | B2 | * | 4/2003 | Matsui et al. | 310/369 |
| 6,555,945 | B1 | * | 4/2003 | Baughman et al. | 310/300 |
| 6,568,286 | B1 | * | 5/2003 | Cabuz | 73/863.33 |
| 6,583,533 | B2 | * | 6/2003 | Pelrine et al. | 310/309 |
| 6,590,985 | B1 | * | 7/2003 | Kirjavainen | 381/71.2 |
| 6,594,369 | B1 | * | 7/2003 | Une | 381/174 |
| 6,634,071 | B2 | * | 10/2003 | Benjamin | 29/25.35 |
| 6,636,760 | B1 | * | 10/2003 | Casey et al. | 73/705 |
| 6,647,169 | B2 | * | 11/2003 | Takeuchi et al. | 385/16 |
| 6,684,469 | B2 | * | 2/2004 | Horning et al. | 29/25.35 |
| 6,689,948 | B2 | * | 2/2004 | Raisanen | 84/733 |
| 2001/0015103 | A1 | * | 8/2001 | Tabota et al. | 73/514.16 |
| 2002/0043895 | A1 | * | 4/2002 | Richards et al. | 310/328 |

* cited by examiner

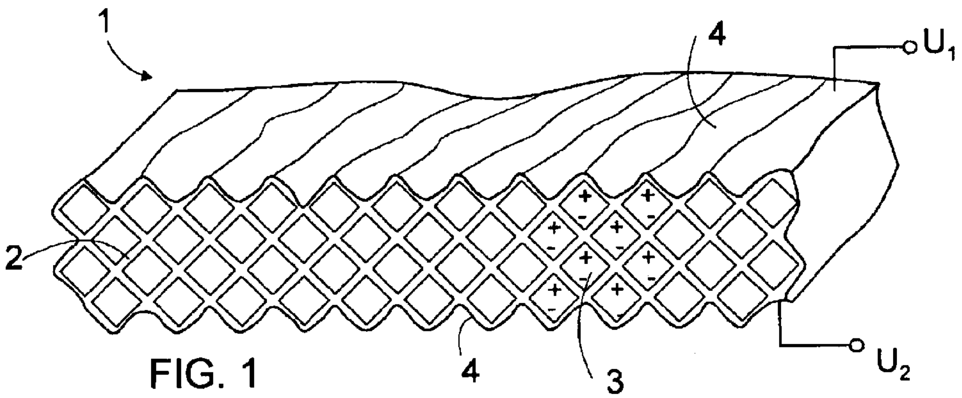
FIG. 1
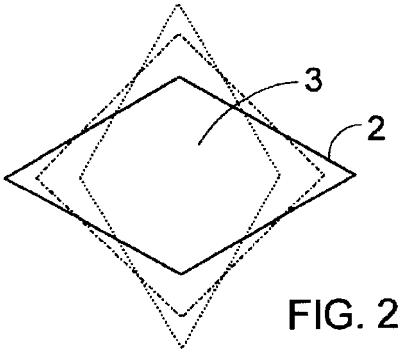
FIG. 2
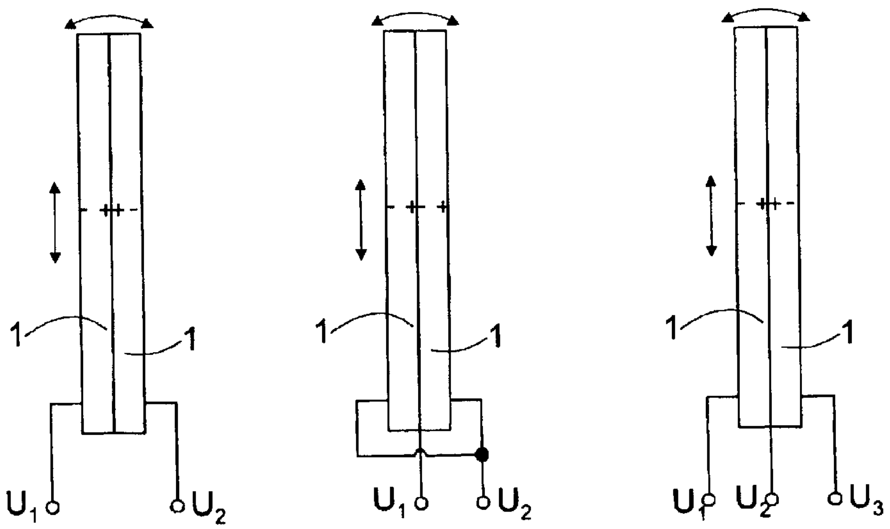
FIG. 3a
FIG. 3b
FIG. 3c

ELECTROMECHANIC FILM AND ACOUSTIC ELEMENT

This application is a Continuation of International Application PCT/F100/01027 filed on Nov. 24, 2000, which designated the U.S. and was published under PCT Article 21(2) in English.

BACKGROUND OF THE INVENTION

The invention relates to an electromechanic film, which film is dielectric and intended for transforming electric energy into mechanical energy and/or transforming mechanical energy into electric energy in such a way that a voltage or a charge is conducted onto the surfaces of the film, and/or a voltage or a charge is discharged from the surfaces of the film.

Further, the invention relates to an acoustic element comprising two electromechanic films joined to each other.

U.S. Pat. No. 4,654,546 discloses an electromechanic film in which the dielectric material is provided with flat discoid gas bubbles. The film can be charged and metallized. When a voltage is conducted over the film, the force generated by the electric field reduces the thickness of the film, whereby the bubbles flatten, and the air inside the bubbles is pressed and the pressure increases. The thickness of the film is thus capable of changing, but the length and width of the film hardly change at all. The change in the thickness is also rather small. At the maximum voltage, the change in the thickness of the film is only about 0.1% of the thickness of the film. In some applications it would be necessary to achieve a greater change in the dimensions of the film.

An object of this invention is to provide an electromechanic film with improved properties compared with the prior art.

SUMMARY OF THE INVENTION

The electromechanic film according to the invention is characterized in that it is formed of cells, the ratio of the height and width of which cells is between 3:1 and 1:3, whereby, when a cell deforms, the pressure resisting the deformation inside the cell remains essentially unchanged.

Further, the acoustic element according to the invention is characterized in that the film is formed of cells, the ratio of the height and width of which cells is between 3:1 and 1:3, and that the acoustic element comprises means for controlling the films in such a way that in the first film the electric field strength decreases and in the second film the electric field strength increases, whereby the joined films in the acoustic element bend.

An essential idea of the invention is that the film is formed of cells, preferably polygonal cells, with thin walls, the ratio of the height and width of which cells is between 3:1 and 1:3. Hereby, when a cell deforms, the pressure resisting the deformation inside the cell changes only a little. The idea of a preferred embodiment is that the cells are elongated in such a way that the ratio of the height and length of the cells is less than 1:3, preferably less than 1:10.

It is an advantage of the invention that when the film is pressed, the cells deform and become wider, and thus the film also becomes wider as the cell walls bend. The longer the cells, the less they resist the deformation of the film.

BRIEF DESCRIPTION OF THE DRAWINGS

The invention is explained in more detail in the attached drawings, in which

FIG. 1 schematically illustrates an electromechanic film obliquely from above;

FIG. 2 schematically illustrates deformation of one cell;

FIGS. 3*a*, 3*b* and 3*c* schematically illustrate an acoustic element comprising two films joined to each other;

DESCRIPTION OF THE PREFERRED EMBODIMENTS

Figure 4:
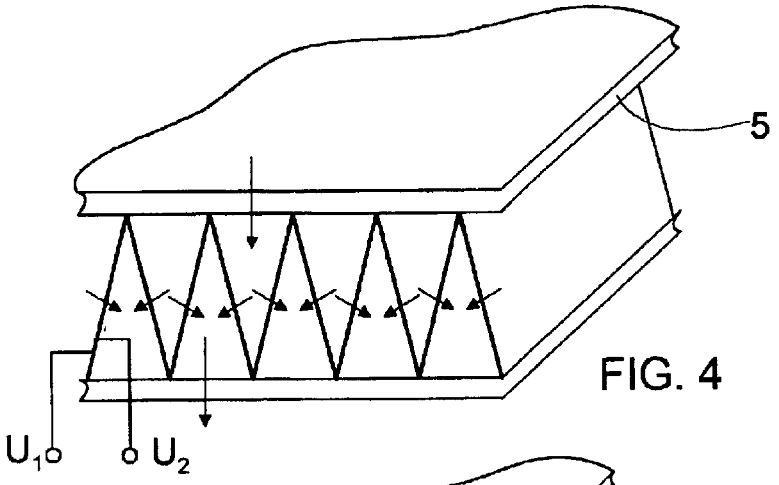
FIGS. 4, 5, 6, 7, 8, 9 and 10 schematically illustrate acoustic elements.

FIG. 1 shows an electromechanic film 1. The film 1 is formed of walls 2, which limit cells 3 within the film. The cells 3 are most preferably polygonal but also curved forms and the like are possible. One preferred form for the cell 3 is hexagonal, whereby the structure of the film 1 is of a honeycomb type. The ratio of the height and width of the cells is between 3:1 and 1:3. Most preferably, the ratio of the height and width is approximately 1:1. FIG. 2 illustrates what happens when a cell deforms. When the height of the cell 3 is at its greatest, as shown by the broken line, the width of the cell 3 is at its smallest. When the height of the cell decreases into the position indicated by the continuous line, the width of the cell increases. However, the volume of the cell does not essentially change during the deformation, so that the pressure inside the cell remains substantially unchanged. Thus, the force resisting the deformation remains small. In other words, when the cell 3 deforms, the pressure resisting the deformation inside the cell 3 does not change essentially, although the change in the thickness of the film 1 can be up to several per cent.

When the film 1 is pressed, i.e. when its thickness decreases, the cells 3 deform and become wider; i.e. when the thickness of the film decreases, the width of the film increases in the same proportion. Most preferably, the cells 3 are elongated and possibly also slightly flattened. Preferably, the ratio of the height and length of the cells 3 is less than 1:3, and most preferably said ratio is less than 1:10. The longer the cells 3, the less they resist the deformation of the film.

The thickness of the film being for example 30 $\mu$m, a change of up to 5% can be achieved in the thickness and width when the charge potential of the film is 800 V and the control voltage 100 V. It is important for the function of the film that the cell walls 2 are as thin as possible, whereby the air volume of the film 1 is as great as possible. Most preferably, the air volume is more than 70%, whereby the films 1 are also very light in weight.

The surfaces of the film must not have an even surface layer which would prevent the film from becoming wider, but the cell pattern must continue as far as to the surface of the film 1. The metal coating arranged on the surface of the film 1 must therefore be very thin.

The film 1 can be produced for instance by extruding a mixture of plastic and nucleation agent, into which propellant gas is injected during the extrusion. The foaming film achieved in this way is blown thinner, stretching it at the same time intensely. In this way, the cells produced are made sufficiently long. Another alternative for providing the film 1 is to press a mixture of plastic and nucleation agent into a film, and after this, to rapidly cool the film. Subsequently, the film is reheated and oriented to some extent in the longitudinal direction, whereby elongated cell preforms are ripped at the boundaries of the plastic and nucleation agent.

After this, the film is led through a pressure chamber, whereby propellant gas flows into the cell preforms, after which the film is oriented in a longitudinal direction, for example tenfold. For example calcium carbonate particles can be used as the nucleation agent.

The film is charged in a strong electric field into an electret film in such a way that a positive charge is formed on the upper surface and a negative charge on the lower surface of the inside of the cells 3. Subsequently, the film 1 is metallized with a thin aluminium layer 4, for example, using vacuum evaporation. In other words, the aluminium layer 4 must be so thin that it does not cover the cell pattern of the surface of the film but allows a change in the width of the film when the thickness of the film changes.

Since the film 1 also widens when pressed, and vice versa, bending structures can be produced by joining at least two films to each other. For instance, in accordance with FIG. 3*a*, by arranging the sides positively charged in the films 1 against each other and by arranging electrodes U1 and U2 on the outer sides and by controlling after this the voltage between the electrodes U1 and U2 in such a way that the strength of the electric field is increased in the first film and decreased in the second film, the element formed of the two films 1 can be made bend. A bending structure can also be achieved in the way presented in FIG. 3*b* or in FIG. 3*c*. The structure according to FIGS. 3*a*, 3*b* or 3*c* can also be used to transform bending movement into electric energy. Hereby, the bending of the structure brings in about an electric charge, and by discharging the electric charge electric energy can be produced. A bending structure can also be provided by means of a film in which the first surface is more rigid than the second surface, in other words there is what is known as a skin layer on the first surface of the film, or its metal coating is thicker than the second surface.

Figure 5:
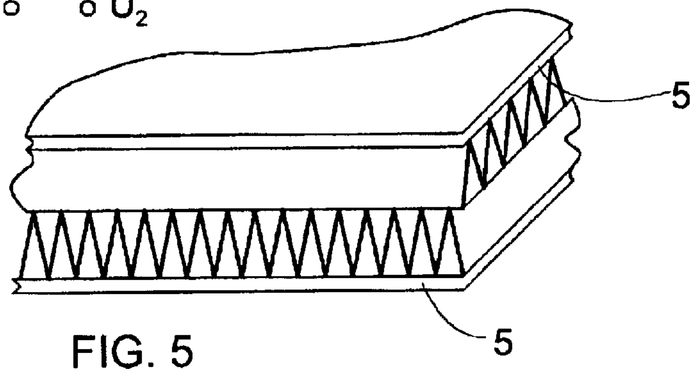

FIGS. 4 to 10 illustrate different acoustic elements in which the above-described electromechanic film is utilized and which can be used for producing, measuring and attenuating sound. FIG. 4 shows an element comprising a pair of films laminated together in accordance with FIG. 3*a*, which pair of films is closely folded in such a way that the height of the folds is about 15 mm, for example, the distance between the folds being about 1 mm, for example. By supplying electric energy the films can be controlled in such a way that the folds bend against each other and the element produces a pressure wave and sound. The element can be coated at least on one side with a porous layer 5. Two elements can also be joined crosswise to each other, whereby a rigid structure is provided, as shown in FIG. 5.

Figure 6:
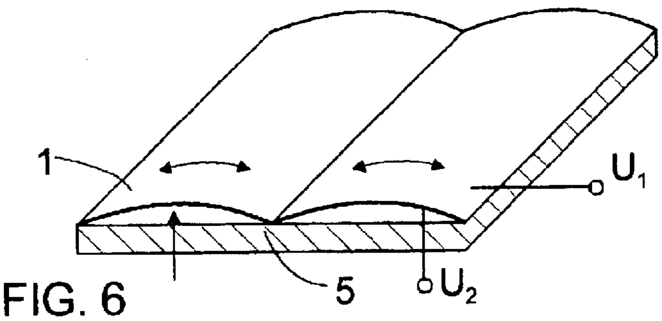

FIG. 6 illustrates an element in which the thinning and simultaneous widening of the film 1 results in movement and acoustic pressure being generated in the film. To increase the power, several film layers can be joined together. The films are attached to a porous support plate 5.

Figure 7:
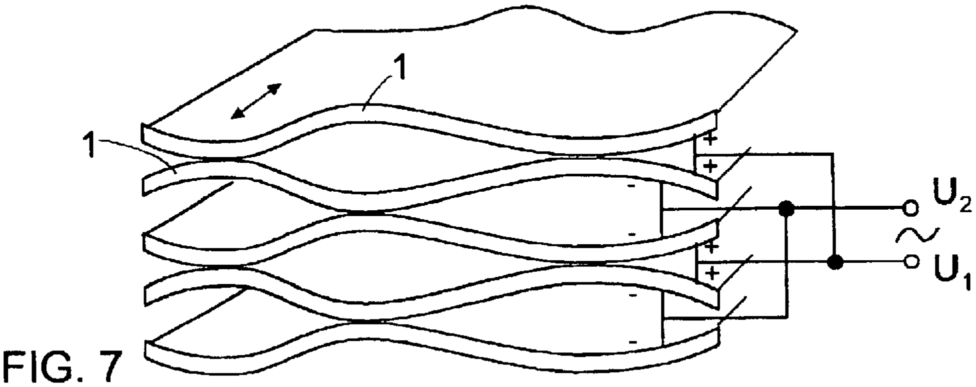

FIG. 7 illustrates a structure in which the change in the lateral direction of the film as a function of the control signal provides a change in the thickness of the whole structure. One of the films 1 can be used as a feedback sensor in the control of the element. A solid or porous plate can be arranged as the back plate of the element.

Figure 8:
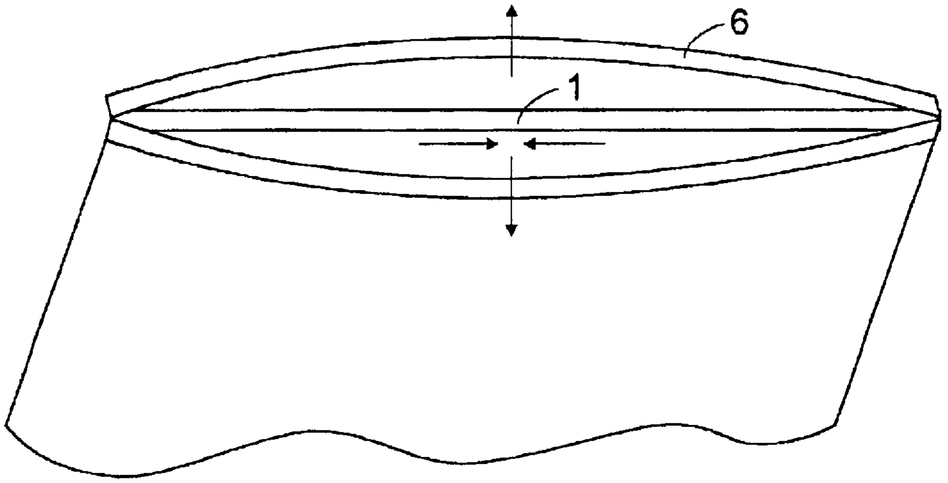

FIG. 8 illustrates an element comprising a film and surface plates 6 arranged around it. As the film 1 widens and narrows as a function of the control signal, the surface plates 6 move in opposite directions.

Figure 9:
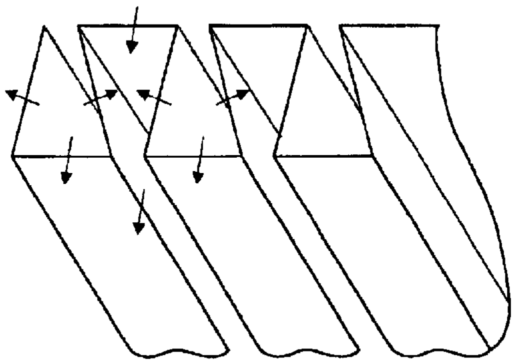

FIG. 9 illustrates an element that comprises at least two films upon each other forming a plate-like structure bent into the form indicated by FIG. 9. The films 1 are controlled separately in such a way that they bend in the way indicated by the arrows. The film layers can be continuous, and the electrodes on the surface thereof can also be continuous. The control of the films takes place as in connection with FIGS. 3 and 4.

Figure 10:
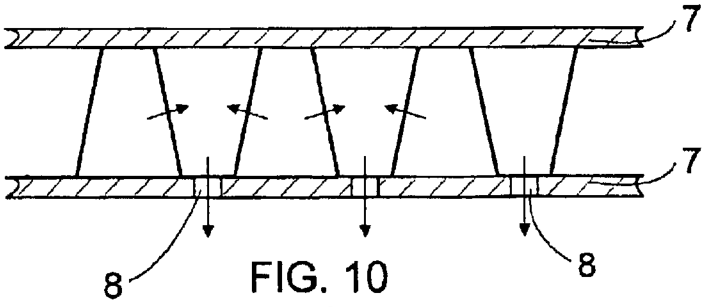
Figure 11:
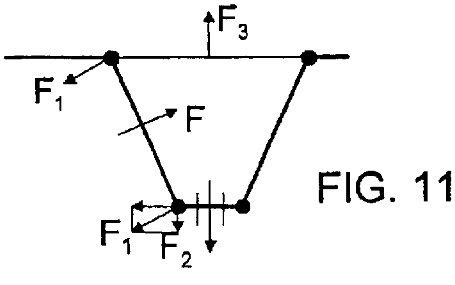
FIG. 11 schematically illustrates forces generated by the acoustic element according to FIG. 10.

FIG. 10 illustrates a solution in which movements of the bending film element other than side-directed are prevented by surface layers 7. The lower surface layer 7 is provided with openings 8, through which the sound generated by the element comes out. By means of the openings the resonance frequency of the element can be adjusted as desired. Production of sound results in recoil force F3 in the element, as indicated in FIG. 11. As movements of the film element other than side-directed are prevented, the mass of the films result in force of movement F, opposing forces F1 of which are directed at the edges of the film. Downward-directed component F2 of the force F1 forms a compensating force for the recoil force F3 of the film element. In other words, the hearer is thus below the element, seen as in FIG. 11; i.e. the sound is conducted, relative to the hearer, from the back surface of the film 1 towards the hearer to compensate for the recoil force of the acoustic element.

The drawings and the related specification are only intended to illustrate the idea of the invention. The details of the invention can vary within the scope of the claims. Thus, the electromechanic film can also be used as different sensors in the measurement of pressure, force and movement, and as different actuators and regulating units. Further, the film can be used as an element for transforming pressure, force and movement or a change in temperature into electric energy. The films are preferably manufactured of plastics, which preserve the electret charge well. Examples of these are cyclic olefin copolymer COC, polymethyl pentene TPX, polytetrafluoroethylene PTFE and polypropylene PP.

What is claimed is:

1. An electromechanic film for transforming electric energy into mechanical energy or transforming mechanical energy into electric energy in such a way that a voltage or a charge is conducted onto the surfaces of the film or a voltage or a charge is discharged from the surfaces of the film, wherein the film is dielectric and formed of cells, the ratio of the height and width of said cells is between 3:1 and 1:3, whereby, when one of the cells deforms, the pressure resisting the deformation inside the cell remains essentially unchanged.

2. The film according to claim 1, wherein the cells are polygonal.

3. The film according to claim 1, wherein the walls of the cells are so thin that the air volume of the film is more than 70%.

4. The film according to claim 1, wherein the cells are elongated in such a way that the ratio of the height and length of the cells is less than 1:3.

5. The film according to claim 4, wherein the ratio of the height and length of the cells is less than 1:10.

6. The film according to claim 1, wherein the film has at least on one side coated with an electricity-conducting layer.

7. The film according to claim 6, wherein the electricity-conducting layer is formed by metallizing the film using vacuum evaporation.

8. The film according to claim 1, wherein the film is at least in some parts charged as an electret film in such a way that the upper surface of the inside of the cells is positively charged and the lower surface of the inside of the cells is negatively charged.

9. An acoustic element comprising at least two electromechanic films joined to each other, wherein the films are formed of cells, the ratio of the height and width of said cells is between 3:1 and 1:3, and the acoustic element comprises means for controlling the films in such a way that in the first film the electric field strength decreases and in the second film the electric field strength increases, whereby the joined films in the acoustic element bend.

10. The acoustic element according to claim 9, wherein folds are formed in the joined films in such a way that when producing sound, the joined films are arranged to move to compensate for the recoil force of the acoustic element.

* * * * *

UNITED STATES PATENT AND TRADEMARK OFFICE

CERTIFICATE OF CORRECTION

PATENT NO. : 6,759,769 B2
DATED : July 6, 2004
INVENTOR(S) : Kari Kirjavainen

It is certified that error appears in the above-identified patent and that said Letters Patent is hereby corrected as shown below:

Title page,
Item [30], Foreign Application Priority Data, change the number of the Finnish priority application from "992514" to -- 19992514 --.

Signed and Sealed this

Twenty-first Day of December, 2004

JON W. DUDAS
*Director of the United States Patent and Trademark Office*